United States Patent [19]

Daetwyler et al.

[11] 4,163,156

[45] Jul. 31, 1979

[54] METHOD OF MODIFYING THE PERFORMANCE CHARACTERISTICS OF A JOSEPHSON JUNCTION

[75] Inventors: Kurt Daetwyler, Oberrieden; Rudolf Jaggi, Langnau a/A, both of Switzerland

[73] Assignee: International Business Machines Corporation, Armonk, N.Y.

[21] Appl. No.: 940,054

[22] Filed: Sep. 6, 1978

Related U.S. Application Data

[63] Continuation of Ser. No. 794,499, May 6, 1977, abandoned.

[30] Foreign Application Priority Data

May 19, 1976 [CH] Switzerland .......................... 6234/76

[51] Int. Cl.$^2$ ............................................ A61K 27/02
[52] U.S. Cl. ................................ 250/492 B; 29/599; 250/310
[58] Field of Search .................... 338/32 S; 29/599; 250/492 A, 492 B, 311, 310; 357/5

[56] References Cited

U.S. PATENT DOCUMENTS

| | | | |
|---|---|---|---|
| 3,600,281 | 8/1971 | Bergmann | 29/599 |
| 3,691,539 | 9/1972 | Erben et al. | 307/306 |
| 3,829,961 | 8/1974 | Bauerlein et al. | 250/492 A |

*Primary Examiner*—Harold A. Dixon

*Attorney, Agent, or Firm*—Thomas J. Kilgannon, Jr.

[57] ABSTRACT

A fabrication technique for adjusting the performance characteristics of a Josephson junction device which can be applied quickly and reliably to a large number of individual junctions, preferably using techniques adaptable to automation, is disclosed. It has been discovered that an electron beam similar to that available in electron beam processing equipment, for example, an electron microscope, can be operated in such a way as to controllably modify the electrical characteristics of a Josephson junction in a fraction of a second. Irradiation of a junction is carried out in such a way that heating of the junction to any substantial degree does not occur while the performance characteristics of a device is being modified. The fabrication conditions are well defined. To obtain modification of device characteristics, the junction thereof is subjected to an electron beam with relatively high accelerating voltage, i.e., in excess of 10 kV, and a certain radiation dosage, i.e., in the order of magnitude of 1 A sec/cm$^2$. The modification process is very local in effect and is a function of time thus enabling feedback control by measuring the characteristic during modification. In a preferred embodiment, the same electron beam by which the resistance of a device is being modified is used to measure the device resistance. Feedback, based on the measured resistance, controls the application of the electron beam to the device.

7 Claims, 13 Drawing Figures

METHOD OF MODIFYING THE PERFORMANCE CHARACTERISTICS OF A JOSEPHSON JUNCTION

This is a continuation of application Ser. No. 794,499 filed May 6, 1977, now abandoned.

BACKGROUND OF THE INVENTION

1. Field of the Invention

This invention relates generally to the field of manufacturing electronic switching devices such as Josephson junctions and specifically relates to manufacturing steps for modifying the performance characteristics of such devices.

2. Description of the Prior Art

Digital applications of Josephson junctions require large groups of junctions each having substantially identical performance characteristics. The difficulty in providing large numbers of extremely small devices, i.e., the Josephson junctions, having identical operating characteristics by control of the processes creating the devices is well recognized. Techniques are known for modifying the performance characteristics of a Josephson junction after it has been created, e.g., by annealing for several hours at elevated temperature, see IBM Technical Disclosure Bulletin, Vol. 17, No. 11, published Apr. 1975, pp. 3488.

SUMMARY OF THE INVENTION

The present invention, in its broadest aspect, relates to a method of modifying the characteristic of a device capable of carrying Josephson current which includes the step of irradiating at least a portion of the junction region of the device with an electron beam of accelerating voltage and current dosage sufficient to modify a characteristic thereof without substantially heating the irradiated portion.

In accordance with the broader aspects of the present invention, the step of irradiating includes the step of scanning the electron beam over at least a portion of the junction region.

In accordance with more specific aspects of the present invention, an accelerating voltage in the range of 10–30 kV and preferentially 15 kV is utilized during the irradiating step. In addition, the current dosage applied is of the order of magnitude of 1 A sec/cm$^2$.

In accordance with still more specific aspects of the present invention, the modification method includes the steps of measuring the change in characteristic simultaneously with the irradiating step.

In accordance with still more specific aspects of the present invention, the step of irradiating is carried out in the presence of either an insulating layer, a metallic layer or both using higher beam accelerating potentials.

It is, therefore, an object of the present invention to provide a Josephson junction characteristic modification method which can be carried out using an electron beam without heating the junction being modified.

Another object is to provide a method of monitoring the characteristic being modified at the same time the modification is being carried out.

Still another object is to provide a method for modifying Josephson junction characteristics which is simple, efficient and applicable to large scale integration.

The foregoing and other objects, features and advantages of the invention will be apparent from the following more particular description of a preferred embodiment of the invention as illustrated in the accompanying drawings.

DESCRIPTION OF PREFERRED EMBODIMENT

Figure 1:
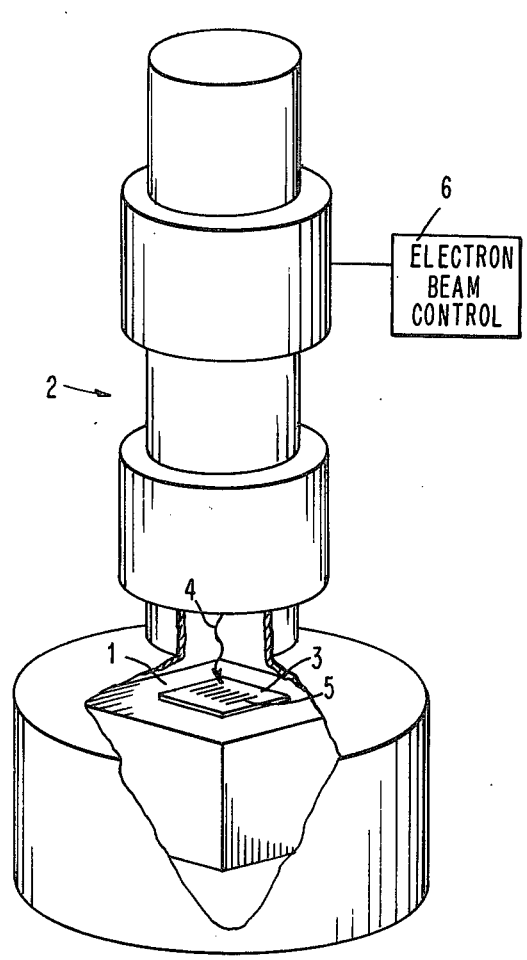
FIG. 1 is a partially cut away perspective view of an electron microscope useful in the practice of the present invention.

In FIG. 1, there is shown the operating table 1 of an electron beam processing apparatus such as an electron microscope 2 as described for example in Scientific American, Vol. 227, No. 5, pp. 34–44, entitled "Microcircuits by Electron Beam" by A. N. Broers and M. Hatzakis, published November 1972. A chip 3 to be treated is subjected to an electron beam 4 which scans individual Josephson devices in a raster pattern 5. The details of the electron microscope 2 are known to those skilled in the art and form no part of the present invention. Other forms of electron beam processing equipment would be equally useful. The important features of suitable equipment are the abilities to generate and precisely direct an electron beam having a current with the range of $10^{-10}$ to $10^{-4}$ Amps.; to accelerate the beam by a voltage of at least 1 kV and precisely focus it by means of controls 6 otherwise designated in FIG. 1 as E.B. control. Electron microscope 2 should be capable of displacing the beam precisely and should be programmable to produce a moving scan or raster pattern. All of these capabilities are well within the state of the electron beam processing equipment art and can be provided by the equipment described in the above-mentioned reference.

Figure 2:
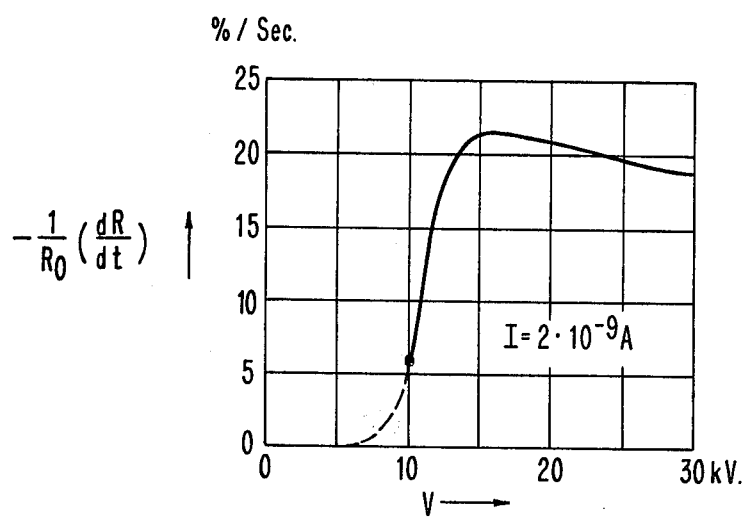
FIG. 2 is a graph of rate of change of room temperature resistance with respect to the initial value of room temperature resistance, $R_o$, versus accelerating potential, which shows the modification effects of electron beam treatment of Josephson junctions in accordance with the present invention.

FIG. 2 shows the modification behavior of a Josephson junction as a function of electron beam accelerating voltage under conditions of constant current dosage. The modification behavior is expressed in terms of change in room temperature resistance at time t=0, $(dR/dT)_{t=0}$, with respect to the initial value of the room temperature resistance $R_o$. Experiments relating to this invention may use Josephson junctions having a pair of lead electrodes separated by a lead oxide barrier layer which are referred to hereinafter as lead junctions. Alternatively, niobium electrodes separated by a niobium oxide barrier layer may be used which are referred to hereinafter as niobium junctions. The curve of FIG. 2 relates to a lead junction. A similar plot for a niobium junction has a characteristic which is more or less in the opposite sense. From FIG. 2 it can be seen that acceleration voltage of about 15 kV produces the most effective results whereas marginal results can be obtained with accelerating voltage as low as 10 kV.

Figure 3:
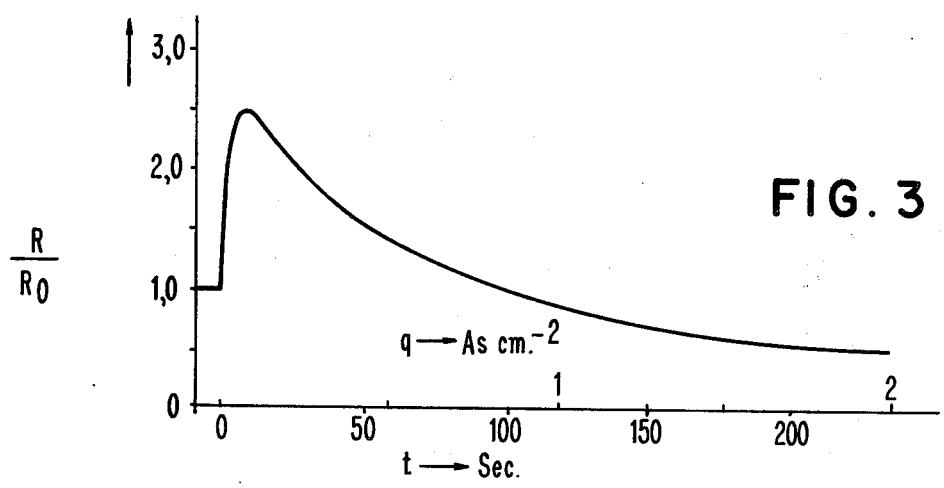
FIG. 3 is a graph of relative room temperature resistance, $R/R_o$, versus time, t, and electron dosage, q, showing the modification behavior typical of a niobium junction.
Figure 4:
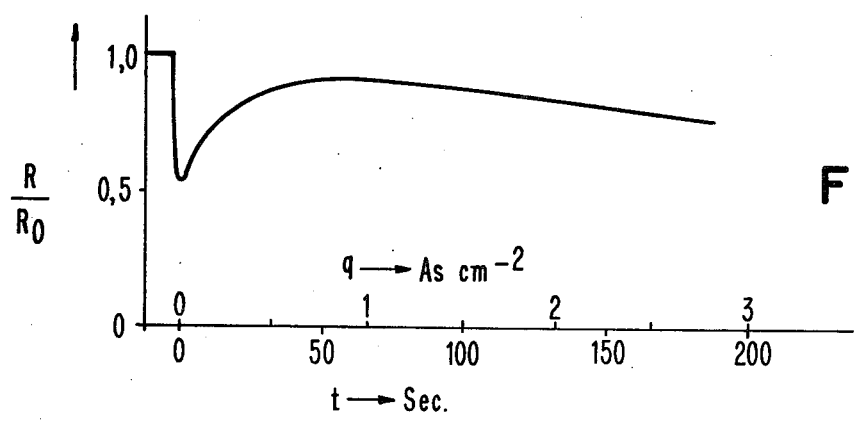
FIG. 4 is a graph of relative room temperature resistance, $R/R_o$, versus time, t, and electron dosage, q, showing the modification behavior typical of a lead junction.

FIG. 3 and 4, respectively, show the modification behavior typical of niobium and lead junctions. The figures depict the relative room temperature resistance $R/R_o$ versus the time, t, and electron beam dosage, q. Dosage is defined as $q=It/A$, where I is the beam current, t the time and A the exposed area. It can be seen that for certain dosage levels, the characteristic parameter $(R/R_o)$ increases and for other dosage levels, the characteristic parameter $(R/R_o)$ decreases. Knowing this behavior and the desired junction characteristic, it can readily be seen how the characteristics of a group of Josephson devices of different materials can be made uniform or otherwise adjusted as desired.

Figure 5:
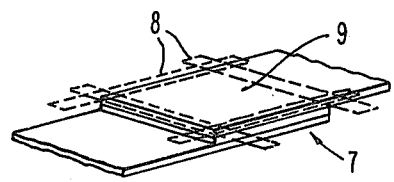
FIG. 5 is a perspective drawing of a Josephson junction which shows an application of the process of the present invention which achieves local modification of device characteristics to control the current density of the device at the periphery of the junction.

Experiments have shown that modifications of device characteristics produced by an electron beam are quite local in effect. This allows special local effects to be achieved. FIG. 5, 6, 7 are examples of such special effects. FIG. 5 shows a perspective drawing of a Josephson junction made of niobium the characteristics of which can be modified by the process of the present invention to control the current density distribution of the junction. A junction 7, the electrodes of which are made of niobium, is known to have irregular performance characteristics caused by current density variations at its peripheral edges. By applying an electron beam in accordance with the teaching of the present application in a pattern 8 which covers the edge regions of the junction 7, the electrical resistance of the edge regions is increased relative to the center portion 9 to lower the current density near the edges.

Figure 6:
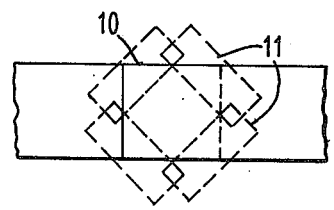
FIG. 6 is a plan view of a Josephson junction similar to that shown in FIG. 5 showing a different treatment pattern for controlling current density at the junction periphery.

FIG. 6 is a plan view of a junction 10 similar to that shown in FIG. 5 but with a different treatment pattern 11 for reducing the effect of current density variation in the junction edge regions.

Figure 7:
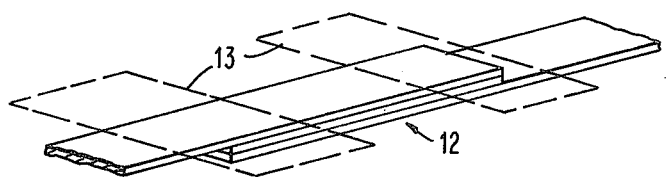
FIG. 7 is a perspective view of a long lead Josephson junction showing an electron beam treatment pattern which encompasses the junction end regions.

FIG. 7 shows a so-called "long lead junction" 12 wherein end regions are subjected to a treatment pattern 13 with an electron beam dosage selected for lowering resistance. Treatment in this manner has been found to modify the gain characteristic of device 12.

Figure 8:
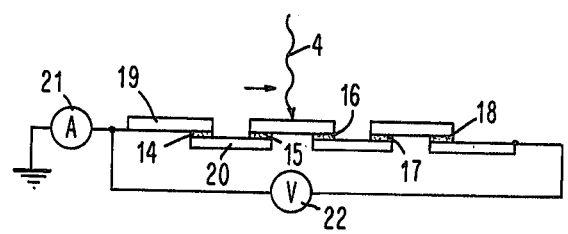
FIG. 8 shows a schematic drawing of a circuit arrangement by means of which an electron beam provides a directable source of current for the measurement of a performance characteristic of an individual device.

FIG. 8 shows schematically a circuit arrangement by which the resistance of individual Josephson junctions 14, 15, 16, 17, 18 can be measured sequentially through the use of electron beam 4 as a source of measuring current. The details of the Josephson junctions themselves are known in the art and let it suffice here to say that each junction, e.g., 14, comprises a thin tunneling barrier layer between a pair of conductors, e.g., 19 and 20. Under operating conditions, the junction can be controlled to exhibit either a voltage state or a zero voltage state by which the junction provides a switching function. The resistance of the junction in the resistance is a critical characteristic of the junction behavior. Experimental evidence shows that this resistance is directly related to the maximum current carried by the Josephson junction when in the zero voltage state. Furthermore, this resistance is effectively observable both at room temperature and at the cryogenic temperatures at which Josephson devices are normally operable. The circuit shown in FIG. 8 includes, in addition to the series connected junctions 14-18, an ammeter 21 connected in series with junctions 14-18 and ground. Furthermore, a volt meter 22 is connected across the string of junctions. Electron beam 4 is successively directed onto the conductors forming the Josephson junctions 14-18, whereby it injects a current that flows to ground. The current is controlled by electron beam microscope control 6 of FIG. 1 and is measurable by the ammeter 21. This current must pass through Josephson junction 14 and 15 which are disposed between the point of the electron beam application and ground. Following Ohm's law, a voltage will be developed as the product of the measured current and the total resistance of the Josephson junction through which the current passes.

Figure 9:
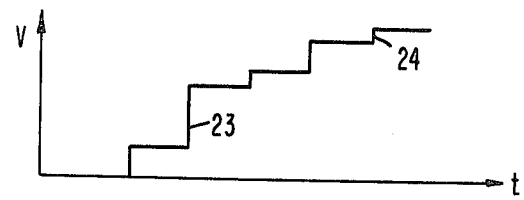
FIG. 9 shows a graph of measured voltage, v, versus time, t, during a continuous left-to-right scan of an electron beam over the junctions shown in FIG. 8.

FIG. 9 shows a plot of measured voltage versus time during a continuous left-to-right scan of the electron beam 4 over the arrangement of FIG. 8. During scanning, a constant electron beam current is maintained. As electron beam 4 progresses from one conductor to an adjacent conductor, i.e., from 19 to 20 in FIG. 8, an increment of voltage is added indicating the resistance of the junction between the two conductors. A relatively large voltage increment 23 reflects a high resistance of the Josephson junction 15, whereas the relatively small voltage increase 24 reflects a low resistance of the Josephson junction 18.

Figure 10:
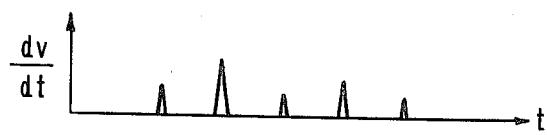
FIG. 10 is the time derivative form of the data shown in FIG. 9.

FIG. 10 shows the same data as presented in FIG. 9 but in the form of the time derivative of the voltage wherein the individual increments are directly measurable.

While this technique would be useful simply for measuring the characteristics of Josephson junctions and can be so applied by maintaining the acceleration voltage of the electron microscope below a threshold of about 1 kV, it is particulary advantageous to employ this measurement technique at the same time the electron beam is operating at acceleration voltage sufficient to modify the resistance characteristic of the Josephson junction itself. Thus, the junction characteristic as it is modified is monitored in a feedback mode to permit the attainment of more uniform end results. Of course, other measuring techniques could be employed to provide similar feedback control.

Figure 11:
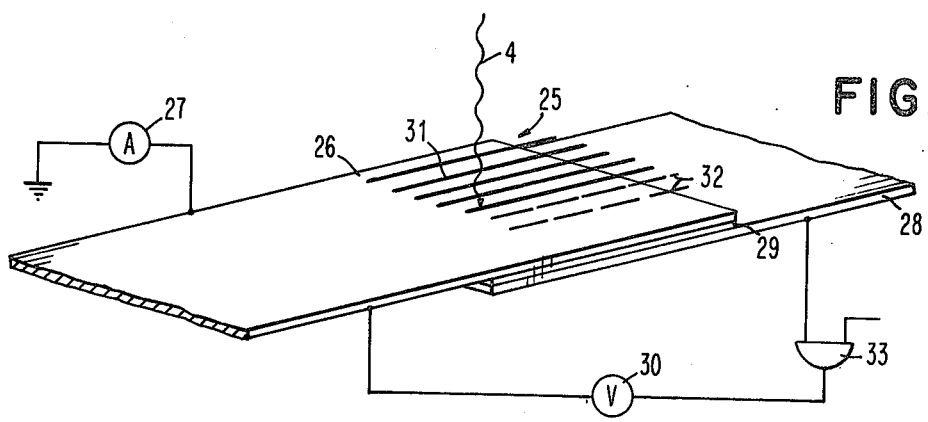
FIG. 11 shows an enlarged view of electron beam treatment of a Josephson junction with the electron beam also serving as a source of current for contemporaneous feedback measurement.
Figure 12:
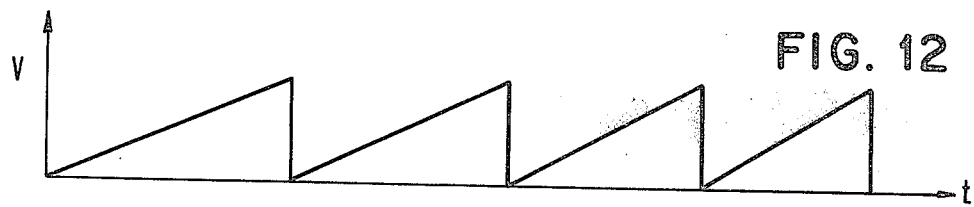
FIG. 12 shows saw tooth signals which are applied in the operation of the arrangement of FIG. 11.
Figure 13:
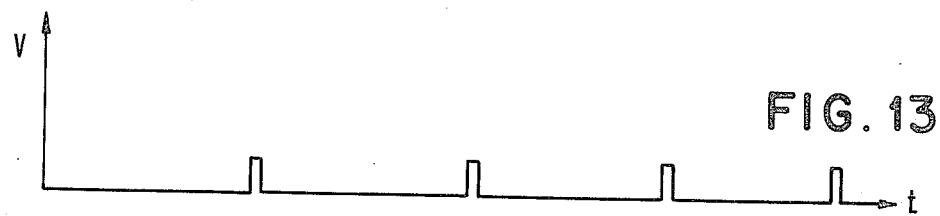
FIG. 13 shows timing signals which may be used to trigger the AND gate shown in FIG. 11 to make voltage measurements during a desired interval.

FIG. 11 shows a greatly enlarged view of a Josephson junction 25 comprising a first conductor 26 connected through an ammeter 27 to ground and a second conductor 28 which is upstream with respect to the ammeter 27. The usual tunneling barrier 29 of the Josephson junction is disposed between the conductors 26 and 28. A volt meter 30 is shown connected across the junction 25. Electron beam 4 is shown as having a scanning path in the form of a raster indicated by heavy lines 31 which have already been scanned by electron beam 4, and dashed lines 32 which are yet to be scanned by beam 4. As is known in the art, the repeated deflections of beam 4 can be produced by a sawtooth wave as shown, e.g., in FIG. 12. It should be noted that individual ones of the scanning lines 31 and 32 cover conductor 26 over tunneling barrier 29 and continue beyond edge of conductor 26 such that beam 4 is, during a portion of each scanning cycle, directly impinging on upstream conducting member 28. During this time, the current passes through tunneling barrier 29 to conductor 26 thus allowing the resistance of tunneling barrier 29 to be measured by voltmeter 30. For automated implementation, a timing signal such as that shown in FIG. 13, synchronized with the sawtooth wave signal of FIG. 12, can be applied to AND gate 33 to connect voltage measuring device 30 only during those periods when beam 4 is directed at the upstream conductor 28. As the measured behavior of the particular junction reaches a preset value, further scanning by electron beam 4 is terminated.

The treatment of Josephson junctions can also be made if the junctions are covered partly or entirely by layers of metal or insulators, e.g., control lines, screens or protective layers. Since such layers are to be penetrated by the electron beam, a higher acceleration voltage is required, e.g., 20–30 kV. It is, therefore, possible to adjust devices after completing manufacture.

While the invention has been particulary shown and described with reference to preferred embodiments thereof, it will be understood by those skilled in the art that the foregoing and other changes in form and details may be made therein without departing from the spirit and scope of the invention.

What is claimed is:

1. A method of modifying the junction characteristics of a device capable of carrying Josephson current comprising the step of:
    scanning an area of the junction region of said device with an electron beam of acceleration voltage in the range of 10–30 kv and current dosage of the order of magnitude of 1A sec/cm sq. to modify the resistance of said an area.

2. A method according to claim 1 wherein said accelerating voltage is 15 kV.

3. A method according to claim 1 further including the step of measuring the change in said resistance simultaneously with said scanning step.

4. A method according to claim 1 further including the steps of:
    connecting an electrode of said device to ground via an ammeter,
    connecting voltage measuring apparatus across said junction,
    scanning at least a portion of another electrode of said device with said electron beam in addition to said first mentioned scanning step, and,
    terminating said first mentioned scanning step when a predetermined voltage is measured by said voltage measuring apparatus.

5. A method according to claim 1 wherein the step of scanning is carried out in the presence of at least one of an insulating layer over said device and at least one conductive layer over said device and at higher accelerating voltage.

6. A method according to claim 1 wherein the step of scanning is carried out to provide a greater dosage in the peripheral region of said device than in the central region thereof.

7. A method according to claim 1 wherein the step of scanning is carried out to provide a greater dosage in the central region of said device than in the peripheral region thereof.

* * * * *